United States Patent [19]

Feldman et al.

[11] Patent Number: 4,824,755
[45] Date of Patent: Apr. 25, 1989

[54] PRESSURE ROLLER DEVELOPED IMAGES VIA PRE-ABRASION

[75] Inventors: Lyudmila Feldman, Centerville; Edward J. Saccocio, Bellbrook, both of Ohio

[73] Assignee: The Mead Corporation, Dayton, Ohio

[21] Appl. No.: 10,922

[22] Filed: Feb. 5, 1987

[51] Int. Cl.⁴ .................. G03C 1/72; G03D 13/00; G03D 13/04; B32B 5/16
[52] U.S. Cl. .................. 430/138; 354/297; 427/11; 427/150; 427/151; 428/402.2; 428/402.21; 428/402.22; 430/122; 503/201
[58] Field of Search .............. 430/138, 122; 346/201; 354/297; 427/11, 150, 151; 428/402.2, 402.21, 402.22

[56] References Cited

U.S. PATENT DOCUMENTS

| | | | |
|---|---|---|---|
| 4,440,846 | 3/1984 | Sanders et al. | 430/138 |
| 4,448,516 | 5/1984 | Arney et al. | 355/27 |
| 4,501,809 | 2/1985 | Hiraishi et al. | 430/211 |
| 4,533,615 | 8/1985 | Arney et al. | 430/138 |
| 4,578,340 | 3/1986 | Saccocio et al. | 430/156 |
| 4,592,986 | 6/1986 | Nelson et al. | 430/138 |
| 4,622,282 | 11/1986 | Head et al. | 430/138 |
| 4,624,560 | 11/1986 | Beery | 430/138 |

*Primary Examiner*—Mukund J. Shah
*Attorney, Agent, or Firm*—Smith & Schnacke

[57] ABSTRACT

A method is provided for rupturing photosensitive microcapsules which form a photosensitive layer on the surface of an imaging sheet which involves abrading the microcapsules such that upon subsequent pressure transfer, the resulting image has significantly greater dynamic range, significantly less midtone mottle and more highlight detail.

14 Claims, 1 Drawing Sheet

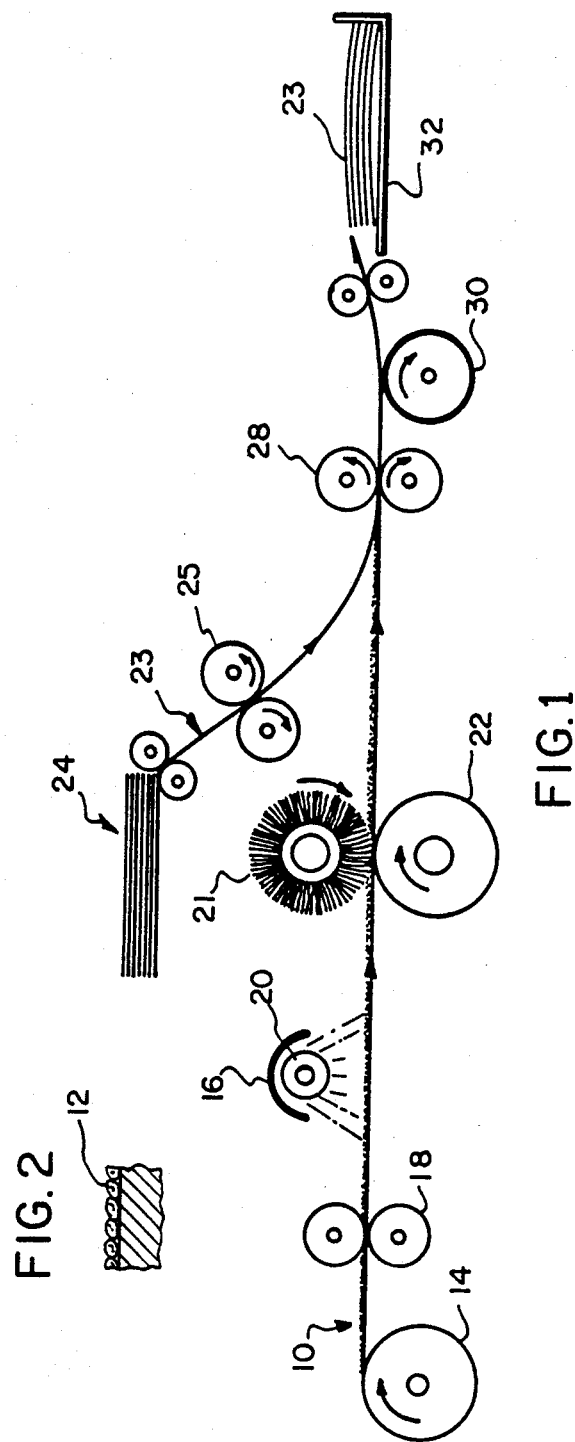

PRESSURE ROLLER DEVELOPED IMAGES VIA PRE-ABRASION

BACKGROUND OF THE INVENTION

The present invention relates generally to an imaging system utilizing imaging sheets having a surface coating of rupturable photosensitive microcapsules, and more particularly, to a method for processing such imaging sheets to obtain an improved pressure roller developed image.

U.S. Pat. Nos. 4,399,209 and 4,440,846, which are assigned to The Mead Corporation and are herein incorporated by reference, describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. An image-forming material, such as a substantially colorless color former, is typically associated with the microcapsules. When the microcapsules rupture, the color former image-wise reacts with a developer material and produces a color image. In the embodiments described in the referenced patents, the microcapsules are typically ruptured by passing the image-wise exposed imaging sheets through the nip between a pair of pressure rollers.

One of the problems encountered in developing the afore-said imaging sheets is that of achieving uniform developing characteristic. After the imaging sheet has been image-wise exposed, contact between the rollers and the imaging sheet surface is believed to be diminished where the microcapsules have been hardened by exposure, and thus, the rollers bridge these exposed microcapsule areas and some of the image detail is lost. The imaging sheet develops unevenly and the tonal characteristics of the resulting images are not entirely satisfactory.

When high pressures are applied to the calendar rollers as required to overcome roller surface irregularities and achieve uniform development across the roller, some of the midtone quality of the developed images is lost. Such a loss due to a loss of differential microcapsule rupture is referred to as midtone mottle. Thus, current processes for developing images through pressure rollers have resulted in images with poor tonal characteristics, midtone mottle and unacceptable highlight detail.

DEFINITIONS

The term "abrade" is used herein to mean that, the microcapsules are rubbed through a frictional, tangential or shearing action to reduce the structural integrity of the microcapsules.

The term "microcapsule" as used herein refers to microcapsules having a discrete microcapsule wall.

The term "photosensitive composition" as used herein means a composition which changes viscosity upon exposure to actinic radiation.

The term "chromogenic material" is used herein to refer to the color forming reactant which is encapsulated or otherwise associated with the microcapsules.

The term "developer" as used herein refers to the color forming reactant not associated with the microcapsules.

SUMMARY OF THE INVENTION

The present invention provides a method of uniformly rupturing photosensitive microcapsules which form a photosensitive layer on the surface of an imaging sheet wherein the microcapsules are abraded and then their contents transferred by passage through the nip formed between two pressure rollers. The abrasion step reduces the structural integrity of bridged microcapsules referred to above so that the subsequent pressure roller development results in an image with significantly greater dynamic range, significantly less midtone mottle and more highlight detail.

Another advantage which abrading the microcapsules provides is the ability to handle the imaging sheet in room light prior to pressure rupture. Microcapsule abrasion renders the microcapsules more oxygen permeable. As the oxygen content of the unexposed microcapsules increases, the ability to polymerize decreases as a result of oxygen's inhibiting action. Thus, the photosensitive material can be exposed to room light for a short period of time without hardening the unexposed microcapsules. The ability to handle the exposed abraded imaging sheet in room light is advantageous because the light tight requirements of current processing equipment prior to microcapsule rupture are reduced.

Thus, an object of the present invention is to provide a method for rupturing photosensitive microcapsules wherein the resultant image has significantly greater dynamic range, significantly less midtone mottle and more highlight detail.

Other objects and advantages of the present invention will become apparent from the following description, the attached drawing and the appended claims.

BRIEF DESCRIPTION OF THE DRAWING

The FIGURE is a schematic illustration of one process for rupturing photosensitive microcapsules in accordance with the present invention.

DETAILED DESCRIPTION OF THE INVENTION

The imaging sheets which are exposed and developed in accordance with the present invention are described in U.S. Pat. Nos. 4,399,209; 4,440,846 and 4,501,809.

The FIGURE is a schematic illustration of one embodiment of the present invention wherein the microcapsules are pre-abraded using a fibrous roller. In the FIGURE, a web 10 carrying a layer 12 of photosensitive microcapsules on the upper surface thereof is supplied from supply roller 14. The web is conveyed to an exposure station 16 via a pair of guide rollers 18. When one frame or picture unit is positioned at the exposure station 16, it is image-wise exposed by radiation source 20. Various means may be used to image-wise expose the layer of microcapsules. For example, exposure apparatuses employing light valves, photomasks, a cathode ray tube, or the like may be employed for this purpose. In the FIGURE, the radiation source has been simplified for purposes of illustration only.

After the layer of microcapsules 12 has been exposed at exposure station 16, the web 10 is advanced and the layer of microcapsules is pre-abraded by contact with the fibrous roller 21 while it is supported by backing roller 22. In the FIGURE, the fibrous roller 21 is shown rotating in a clockwise direction, however, in an alternative embodiment, the fibrous roller 21 could be rotated in a counterclockwise direction. The velocity of the fibrous roller 21 and the velocity of the web 10 are adjusted so as to accomplish the desired degree of pre-abrasion.

As discussed below in more detail, the FIGURE illustrates only one means, namely a fibrous roller for pre-abrading the microcapsules layer. Other means that may be used include a free particle bed and a magnetic brush. In addition, in the illustrated embodiment, the web can be supported by means other than the backing roller 22, for example, a planar support means may be used.

The web 10, after pre-abrasion, is next conducted to a station where it is assembled with a receiver sheet. In the FIGURE, receiver sheets 23 are schematically illustrated as being fed from a stack 24. A variety of conventional sheet handling and conveying means can be used to feed the receiver sheets from the stack 24 into contact with the web 10. In the illustrated embodiment, the receiver sheet 23 is schematically shown as being fed into contact with the web 10 via guide rollers 25.

With the receiver sheet 23 assembled with the web 10, the two are passed through the nip between pressure rollers 28. These rollers are designed to obtain an even lineal distribution of the pressure across the surface of rollers. Upon passing through the nip between the pressure rollers 28, the microcapsules in layer 12 are ruptured and their contents is transferred to the receiver sheet where it reacts to form a color image.

After rupturing the microcapsules, the receiver sheet is separated from the web 10 and collected in tray 32. Again, conventional sheet handling means can be used for this purpose. The web 10 is collected on take-up roller 30.

While the FIGURE illustrates an embodiment in which individual receiver sheets 23 are fed into contact with web 10, those skilled in the art will appreciate that the receiver sheets may be supplied in the form of a continuous web which is cut or separated after passing pressure rollers 28.

The receiver sheets used in the present invention may be developer sheets which carry a layer of reactant such as a developer resin which reacts with the color former released from the capsules to produce a colored image. Alternatively, the receiver sheet may be a sheet of plain bond paper which receives a colored dye released from the capsules or the dye product of a color former and a developer released from a self-contained imaging sheet as described in U.S. Pat. Nos. 4,440,846 or 4,501,809. In either embodiment, bridging of the exposed areas of the imaging sheet is reduced and images of improved quality are obtained.

A variety of combinations of roller drive mechanisms, catchers or other finishing apparatus are useful herein.

In accordance with another embodiment of the present invention, the microcapsules can be abraded by a body of free particles and establishing relative movement between the surface of the imaging sheet and the body of free particles such that the free particles move over the microcapsules on the surface on the imaging sheet to thereby abrade the microcapsules. Commonly assigned U.S. Pat. No. 4,578,340 discloses useful means for abrading the microcapsules in accordance with this embodiment of the present invention and is incorporated herein by reference.

In the simplest form of apparatus for performing free particle abrasion, an imaging sheet is placed into a tray with a body of free particles also placed into the tray over the imaging sheet. The tray is then vibrated such that the free particles move over the surface of the imaging sheet to thereby abrade the microcapsules.

In a second embodiment of apparatus for performing free particle abrasion of imaging sheets, a tray supports the body of free particles and a cylinder is horizontally mounted above the tray for rotation about an axis. An imaging sheet is secured to the cylinder such that the surface of the imaging sheet is mounted with the microcapsules facing outwardly. The imaging sheet is then processed by rotating the cylinder such that the surfaces of the microcapsules contact the body of free particles.

In a third embodiment of apparatus for performing free particle abrasion of imaging sheets, a primary cylindrical drum is mounted for rotation about a horizontal axis. An imaging sheet is positioned along the interior surface of the drum and clamped into place. As the drum is rotated, a body of free particles placed in the drum move over the surface of the imaging sheet to abrade the microcapsules thereon.

In accordance with another embodiment of the present invention, the microcapsules are abraded by a magnetic brush. An imaging sheet is passed over the magnetic brush so that the magnetic brush and traveling pile of magnetically attractable free particles move over the microcapsules on the surface of the imaging sheet to abrade the microcapsules. Typically, the direction of travel of the pile and the imaging sheet are the same along the area of contact between the imaging sheet and magnetic brush. Commonly assigned U.S. Pat. No. 4,592,986 discloses apparatus which are useful in practicing the magnetic brush abrasion embodiment of the present invention and is incorporated herein by reference.

In accordance with another embodiment for magnetic brush abrasion, an imaging sheet carrier cylinder is mounted for rotation about an axis parallel to the magnetic brush with a cylinder being sized and positioned such that the pile traveling on the magnetic brush is just slightly greater than the gap between the sleeve and cylinder. The imaging sheet carrier cylinder can be operated in the same or opposite direction as that of the moving pile on the magnetic brush. However, typically, the imaging sheet is secured to the outer surface of the cylinder to travel in the same direction as the pile on the magnetic brush. After abrading the microcapsules, the particles are deposited back to the trough as the cylinder is rotated such that the particles are continuously recirculated to form the pile of the brush.

Regardless of the abrasion technique used, the microcapsule content is transferred by pressure. Any pressure rollers which crush, squeeze, diffuse or physically contact the microcapsules such that they transfer their contents are useful in the present invention.

After exposure, as illustrated in the FIGURE, the microcapsule contents are transferred by passing the abraded imaging sheet through the nip between a pair of pressure rollers.

The present invention is illustrated in more detail by the following non-limiting examples:

EXAMPLE 1

Imaging sheets prepared in accordance with the teachings of U.S. Pat. No. 4,399,209 having an internal phase containing a photoinitiator, trimethylolpropane triacrylate, and a magenta color former were exposed to actinic radiation through a step wedge in a conventional manner. Sample 1 was developed by assembling the imaging sheet with a developer sheet and passing the assembly directly through a pair of pressure rollers. Sample 2 was subjected to pre-abrasion by brushing the imaging sheet manually with a coarse brush. Thereafter the imaging sheet was assembled with a developer sheet and the assembly was passed through pressure rollers in the same manner as sample 1. Three other samples (A, B and C) were pre-abraded in a similar manner to sample 2 and exposed to white light five minutes, ten minutes and forty minutes, respectively, before being assembled with a developer sheet and subjected to pressure as in sample 1. The results are shown in Table I below.

TABLE I

| Step # | Sample 1 Density | 2 Density | A Density | B Density | C Density |
|---|---|---|---|---|---|
| 1 | 0.10 | 0.20 | 0.31 | 0.28 | 0.30 |
| 5 | 0.13 | 0.39 | 0.42 | 0.40 | 0.35 |
| 10 | 0.28 | 0.67 | 0.76 | 0.65 | 0.67 |
| 15 | 1.34 | 1.59 | 1.62 | 1.52 | 1.15 |
| 20 | 1.85 | 1.96 | 1.88 | 1.90 | 1.65 |
| 25 | 1.87 | 1.94 | 1.87 | 1.88 | 1.69 |
| 30 | 1.80 | 1.97 | 1.87 | 1.92 | 1.71 |

The results of the study show that pre-abrasion substantially enhances image density and, in the case of samples A, B and C illustrates that pre-abrasion effectively desensitizes the imaging sheet thereby reducing demands for a light tight developing apparatus.

EXAMPLE 2

An imaging sheet was prepared by coating a polyester substrate with microcapsules containing TMPTA, 2-isopropylthioxanthone, ethyl p-dimethylaminobenzoate and a cyan color former. The imaging sheet was exposed to a 390 nm radiation source through a step wedge. Samples 1 and 2 were developed without pre-abrasion. Sample 3 received moderate pre-abrasion by manual brushing with a coarse brush. Sample 4 received vigorous pre-abrasion by manual brushing with a coarse brush. The results are shown in Table II below.

TABLE II

| Step # | Sample 1 Density | 2 Density | 3 Density | 4 Density |
|---|---|---|---|---|
| 1 | .10 | .11 | .11 | .13 |
| 5 | .11 | .11 | .13 | .16 |
| 10 | .21 | .19 | .24 | .36 |
| 15 | 1.26 | 1.02 | 1.53 | 1.75 |
| 20 | 1.72 | 1.66 | 1.75 | 1.86 |
| 25 | 1.70 | 1.61 | 1.80 | 1.79 |
| 30 | 1.71 | 1.68 | 1.75 | 1.89 |

The results show that pre-abrasion improves imaging density and that the image quality can, to a degree, be controlled by controlling the degree of pre-abrasion.

EXAMPLE 3

The imaging sheet described in Example 2 was exposed through a step wedge to a 390 nm radiation source. Sample A was developed without pre-abrasion. Sample B was developed by contacting the imaging sheet with a rotating magnetic brush. The results are shown in Table III. An improvement in density is observed in the midtone region of Sample B.

TABLE III

| Step # | Sample A Density | B Density |
|---|---|---|
| 1 | 0.14 | 0.11 |
| 5 | 0.10 | 0.13 |
| 10 | 0.14 | 0.25 |
| 15 | 1.60 | 1.92 |
| 20 | 2.59 | 2.43 |
| 25 | 2.61 | 2.46 |
| 30 | 2.55 | 2.47 |

Having described the invention in detail by reference to preferred embodiments thereof, it will be apparent that modifications and variations are possible without departing from the scope of the invention defined in the appended claims.

What is claimed is:

1. A method for developing a latent image in an imaging sheet having a layer of microcapsules containing a photosensitive composition on the surface thereof comprising the steps of:
    abrading said microcapsules on said surface of said sheet;
    after abrading said microcapsules, assembling said imaging sheet with a receiver sheet; and
    after assembling, transferring the contents of said microcapsules to said receiver sheet by passing said assembly through a nip between a pair of pressure rollers to subject the microcapsules to pressure such that an image is formed on said receiver sheet.

2. The method of claim 1 wherein said step of abrading said microcapsules comprises contacting said microcapsules with a rotating roll having a fibrous outer surface.

3. The method of claim 1 wherein said step of abrading said microcapsules includes establishing relative movement between said sheet and body of free particles such that said free particles move over said microcapsules on said surface of said sheet and thereby abrade said microcapsules.

4. The method of claim 1 wherein said step of abrading said microcapsules includes contacting said microcapsules with a rotating magnetic brush.

5. The method of claim 1 wherein said receiver sheet is a developer sheet.

6. The method of claim 1 wherein said receiver sheet is plain paper.

7. In an imaging system in which images are formed by image-wise releasing one or more chromogenic materials utilizing an imaging sheet having a coating containing a chromogenic material and a photosensitive composition, said photosensitive composition and said chromogenic material being encapsulated in rupturable microcapsules as an internal phase, a method of developing a latent image formed on said imaging sheet by image-wise exposure of said sheet to actinic radiation comprising the steps of:
    abrading said microcapsules on said surface of said sheet;
    after abrading said microcapsules, assembling said imaging sheet with a receiver sheet; and
    after assembling, transferring the contents of said microcapsules to said receiver sheet by passing said assembly through a nip between a pair of pressure rollers to subject the microcapsules to pressure whereby said internal phase is transferred to said receiver sheet and an image is formed on said receiver sheet.

8. The method of claim 7 wherein the step of abrading said microcapsules includes contacting said microcapsules with a rotating developer roll having a fibrous outer surface.

9. The method of claim 7 wherein the step of abrading said microcapsules includes establishing relative movement between said sheet and a body of free particles such that said free particles move over said microcapsules on said surface of said sheet and thereby abrade said microcapsules.

10. The method of claim 7 wherein the step of abrading said microcapsules includes contacting said microcapsules with a magnetic brush.

11. The method of claim 7 wherein said receiver sheet is a developer sheet.

12. The method of claim 7 wherein said receiver sheet is plain paper.

13. The method of claim 1 wherein said step of subjecting said assembly to pressure comprises passing said assembly through the nip between a pair of pressure rollers.

14. The method of claim 7 wherein said step of subjecting said assembly to pressure comprises passing said assembly through the nip between a pair of pressure rollers.

* * * * *